(12) United States Patent
Joos et al.

(10) Patent No.: US 7,176,759 B2
(45) Date of Patent: Feb. 13, 2007

(54) DIFFERENTIAL LOW NOISE AMPLIFIER WITH LOW POWER CONSUMPTION

(75) Inventors: Dieter Joos, Londerzeel (BE); Marc Borremans, Korbeek-Dijle (BE)

(73) Assignee: STMicroelectronics S.A., Montrouge (FR)

( * ) Notice: Subject to any disclaimer, the term of this patent is extended or adjusted under 35 U.S.C. 154(b) by 21 days.

(21) Appl. No.: 11/022,050

(22) Filed: Dec. 23, 2004

(65) Prior Publication Data

US 2005/0140443 A1    Jun. 30, 2005

(30) Foreign Application Priority Data

Dec. 24, 2003    (EP)    ................................. 03079182

(51) Int. Cl.
*H03F 3/45* (2006.01)
(52) U.S. Cl. ...................... 330/253; 330/261; 330/311
(58) Field of Classification Search ................ 330/253, 330/261, 311
See application file for complete search history.

(56) References Cited

U.S. PATENT DOCUMENTS

| | | | |
|---|---|---|---|
| RE31,545 E | * | 3/1984 | Quinn ........................ 330/149 |
| 4,462,002 A | * | 7/1984 | Schade, Jr. .................. 330/253 |
| 4,901,031 A | | 2/1990 | Kalthoff et al. |
| 5,602,508 A | | 2/1997 | Endou et al. |
| 6,417,737 B1 | * | 7/2002 | Moloudi et al. ............. 330/301 |
| 6,580,323 B2 | * | 6/2003 | Mateman et al. ........... 330/252 |
| 6,985,035 B1 | * | 1/2006 | Khorramabadi ............. 330/253 |

FOREIGN PATENT DOCUMENTS

WO    WO03/085821 A1    10/2003

OTHER PUBLICATIONS

European Search Report from corresponding European National Application No. 03079182, filed Dec. 24, 2003.

* cited by examiner

*Primary Examiner*—Patricia Nguyen
(74) *Attorney, Agent, or Firm*—Lisa K. Jorgenson; James H. Morris; Wolf, Greenfield & Sacks, P.C.

(57) ABSTRACT

A low noise differential amplifier has a pair of single ended common-gate or common-base circuits and cross coupling of an input of one of the pair to the gate or base of the other one of the pair. This cross-coupling puts the differential input voltage over the Gate-Source of the common-gate transistor (or Base-Emitter of the common base transistor). This means that the same input impedance and gain can be made with half the current compared to a basic common-gate topology. The cross-coupling means the noise generated by the positive side of the common-gate structure ends up partly on the negative output and vice versa, and so the Noise Figure can be less than 3 dB.

15 Claims, 3 Drawing Sheets

DIFFERENTIAL LOW NOISE AMPLIFIER WITH LOW POWER CONSUMPTION

BACKGROUND OF THE INVENTION

1. Field of the Invention

This invention relates to low noise amplifiers (LNA), to integrated circuits and receivers and consumer equipment having such amplifiers, and to methods of amplifying signals.

2. Discussion of the Related Art

It is known to use an LNA to amplify input signals coming from an antenna of a radio receiver. The Noise Figure NF of this circuit is an important parameter and needs to be small. The input impedance of the LNA needs to be matched with the impedance of the antenna. The practical implementation of the impedance matching and the low NF leads typically to considerable power consumption. This can be reduced by using coils in the circuit. Circuits using coils have been reported as achieving very small noise levels (e.g. NF<3 dB). However, they also have a number of drawbacks, such as EM coupling and large die size. They consume large areas of integrated circuits or hybrid packages. To obtain an accurate impedance with such coils, very specific CAD tools and/or several test structures are required, delaying the development, and adding to manufacturing costs as there needs typically more than one iteration to tune the circuit. The input impedance is highly sensitive to parasitics and difficult to control.

To avoid such difficulties, it is known to use a common gate or common base structure as shown in FIG. 1. The arrangement can be single sided or differential, the parts needed for the differential arrangement being shown in dotted lines. A first transistor 10 is coupled in series with a current source 20 and a load resistor 30. The base or gate is tied to an ac-ground, the input signal is applied to a point between the current source and the transistor, and the output is taken from a point between the load resistor and the transistor. For the differential arrangement, a corresponding set of components is shown, including second transistor 50, load resistor 60, and current source 70.

For common base or common gate designs generally, the key properties are wide bandwidth, and a matched input impedance. This structure has the advantage that no coils are needed and the input impedance is very well controlled. Disadvantages of this basic common base or common gate structure include the fact that there is a theoretical 3 dB NF limit and the fact that the circuit is power hungry in order to have a certain input impedance.

SUMMARY OF THE INVENTION

According to a first aspect, the invention provides a low noise differential amplifier having a pair of single ended circuits having a common electrode. A cross coupling of an input electrode having a first polarity of each of the pair to a second inverse polarity input electrode of the other one of the pair is provided. The first (or second, respectively) polarity electrode is a first main electrode of a transistor such as a source or emitter electrode and the second (or first, respectively) polarity electrode is a second main electrode such as a gate or base electrode of a transistor. The present application can be implemented using any suitable circuit components, e.g. bipolar transistors or FET's. By cross-coupling the differential ac-signal is applied at each relevant input electrode (source or emitter, gate or base). The use of the term common electrode describes a circuit topology and not that this node is connected to AC-ground.

In this new topology a cross-coupling is used between 2 single ended structures. This cross-coupling puts the differential input voltage over the Gate-Source of each of the transistor pair (or Base-Emitter of each of the transistor pair). This means that the same input impedance and gain can be made with half the current compared to a basic common-gate or common-base topology. This structure can overcome the disadvantages of the basic common base or common-gate structure of the theoretical 3 dB NF limit and the amount of power needed. In the new topology an NF lower than 3 dB is easily achieved and for the same input impedance (and gain) only half the current is needed. Further advantages include small area as well as the capability of being fully integrated.

By making this cross-coupling the noise generated by the positive side of the common-electrode structure ends up partly on the negative output and vice versa. Hence the noise is partly transferred in correlated common-mode noise and so an NF below 3 dB can be achieved. This new topology can provide benefits in two domains: Half the current for the same input impedance, the same gain and better NF. It exploits the differential input signal, to make a cross-coupling to enable a lower power solution while maintaining a good NF. Compared to the use of coils, the die-area is much reduced, the circuit is easy to implement and the input impedance and the gain are well defined. Also EM coupling problems of coils are avoided. Even with the lower current, the NF can drop under the theoretical limit of a common-gate structure (NF=+/−2.5 dB dependent on the models and frequency). A common-gate structure in combination with coils can have better NF, but the other disadvantages of coils usually outweighs this point.

As preferred additional features, the cross coupling includes a series coupled capacitor. The cross-coupled capacitors provide a split between the DC and AC signals. The DC gate-source voltage can be determined according to the optimal circuit biasing, while the RF signal is shorted through the capacitive elements.

Another such feature is a resistor, for coupling the gate or base of each transistor to a DC bias node to ensure proper DC biasing. Another such element is a load, which may be passive such as a resistor or an inductor, for example, or an active load such as an active circuit. An advantage is obtained by cross-coupling at the gate and source (or base and emitter) nodes of the input transistors and this is independent of the type of load.

Another such feature is each single ended common electrode structure comprising a load resistor, a transistor and a current source coupled in series, with the input being between the transistor and the current source.

Another aspect of the invention provides an integrated circuit having the amplifier.

Another aspect provides a receiver coupled to an antenna for receiving radio signals, and having the amplifier for amplifying the signals received by the antenna.

Another aspect of the invention provides consumer equipment having an antenna and the receiver.

How the present invention may be put into effect will now be described with reference to the appended schematic drawings. Obviously, numerous variations and modifications can be made without departing from the claims of the present invention. Other advantages may be apparent to those skilled in the art especially over other prior art not known to the inventors. It should be clearly understood that the form of the present invention is illustrative only and is not intended to limit the scope of the present invention.

BRIEF DESCRIPTION OF THE DRAWINGS

The features of the invention will be better understood by reference to the accompanying drawings, which illustrate preferred embodiments of the invention. In the drawings.

DETAILED DESCRIPTION

Figure 1:
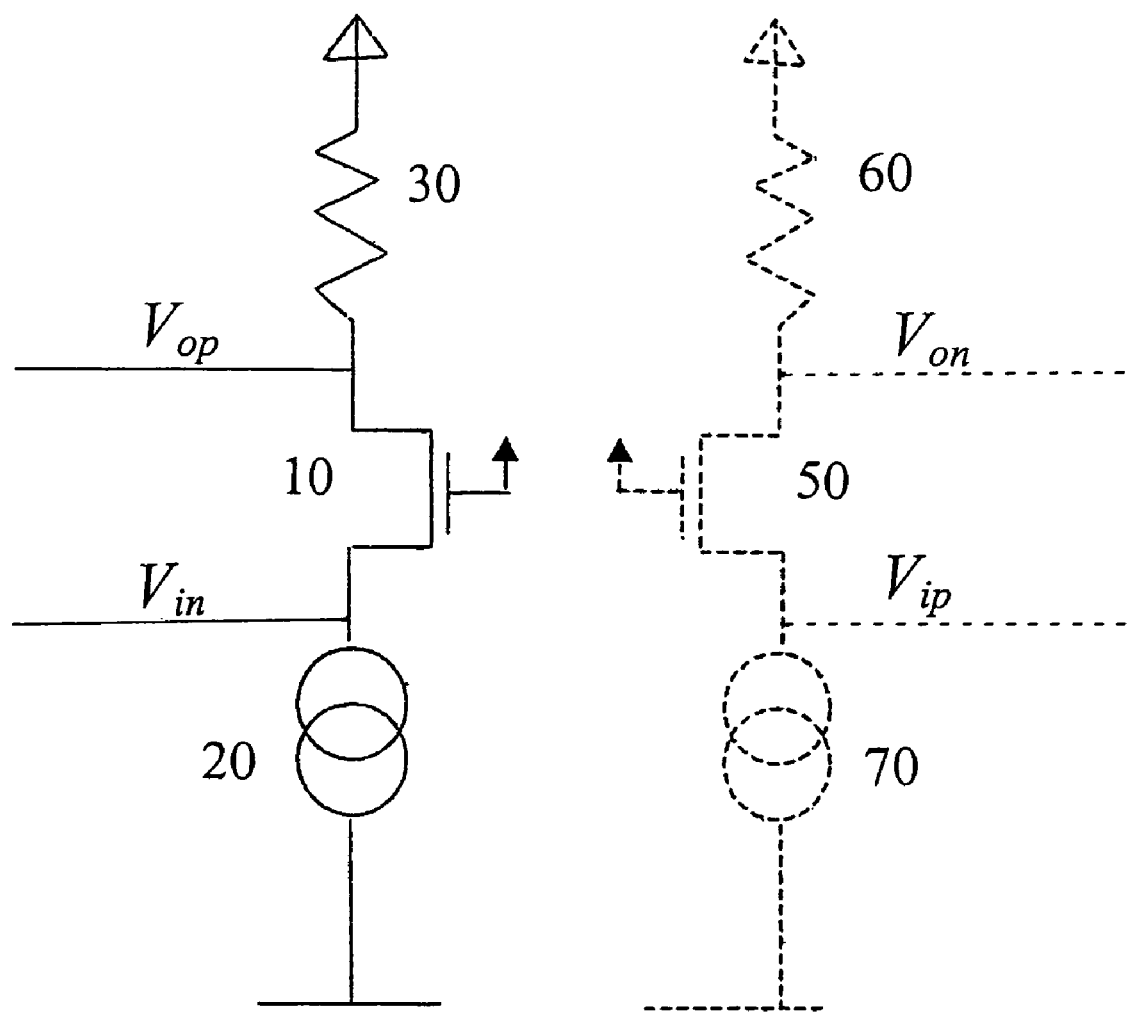
FIG. 1 shows a prior art common gate amplifier topology (single ended or differential)

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, any such terms as top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

In the following description reference may be made to FET's and their relevant electrodes. However, the present invention is not limited to FET's but includes any type of circuit element or circuit with a control electrode, e.g. bipolar transistors or a combination or circuit of transistors. In the case of an FET this control electrode is a gate, in the case of a bipolar transistor it is a base.

Figure 2:
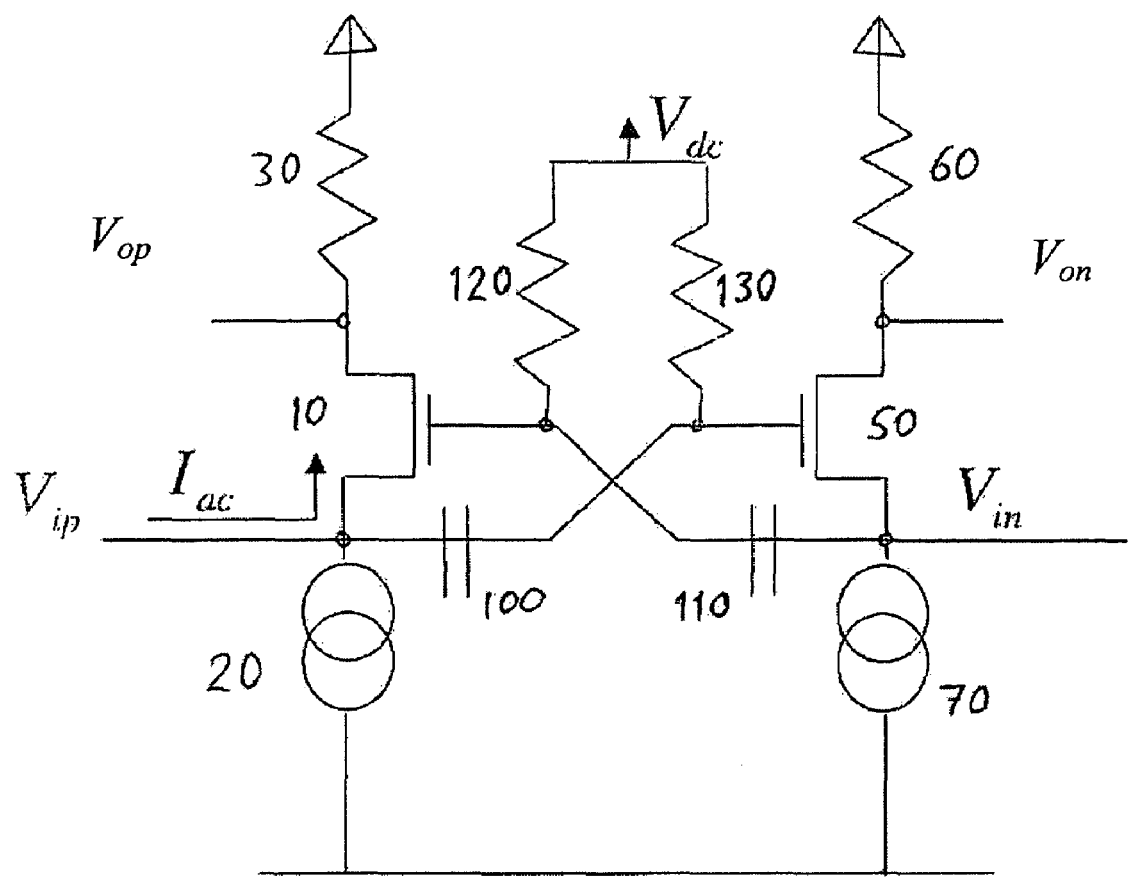
FIG. 2 shows an amplifier having a differential topology with cross-coupling, according to an embodiment of the invention.

A first embodiment of the invention, illustrated in FIG. 2 shows an amplifier having a differential topology with cross-coupling. Corresponding reference numerals to those of FIG. 1 have been used as appropriate. The differential amplifier has a first side with load resistor 30, transistor 10 (as an example of an amplifier element) and current source 20 (as an example of a source load) coupled in series. An input $V_{ip}$ is applied to the point between a first main electrode of the transistor (e.g. the source) and the current source. An output $V_{op}$ (positive output) is taken from the point between the load resistor and a second main electrode of the transistor (e.g. the drain). The other side of the differential amplifier is a mirror image, with load resistor 60, transistor 50 and current source 70 coupled in series. An input $V_{in}$ (negative input) is applied to a point between a first main electrode (e.g. the source) the transistor 50 and the current source 70. An output $V_{on}$ (negative output) is taken from the point between the load resistor 60 and a second main electrode of the transistor (e.g. the drain).

The cross coupling includes a link from the first main electrode, e.g. the source, of transistor 50, to the gate of transistor 10, via a series capacitor 110. Correspondingly, there is a link from the first main electrode, e.g. the source, of transistor 10, to the gate of transistor 50, via a series capacitor 120. A bias resistor 120 couples the gate of transistor 10 to a DC bias node, and a bias resistor 130 couples the gate of transistor 50 to a DC bias node. The transistors and other elements can be chosen to suit the application, following conventional design principles. Although only two transistors have been shown, the present invention includes the use of several transistors and also includes circuits or other devices having amplifying properties.

In operation, this cross-coupling puts the differential input voltage on a Gate-first main electrode, e.g. Gate-Source of a common-gate transistor (or Base-Emitter of the common base transistor). This means that the same input impedance and gain can be made with half the current compared to a basic common-gate topology. This can overcome the disadvantages of the basic common base structure of the theoretical 3 dB NF limit and the amount of power needed. In the new topology an NF lower than 3 dB is easily achieved and for the same input impedance (and gain) only half the current is needed. By making this cross-coupling the noise generated by the positive side of the common-gate structure ends up partly on the negative output and vice versa. Hence some of the noise cancels and so a NF below 3 dB can be achieved. This new topology can provide benefits in two domains: Half the current for the same input impedance, the same gain and better NF. It exploits the differential input signal, to make a cross-coupling to enable a lower power solution while maintaining a good NF. The lower power is especially useful for applications such as mobile consumer equipment, or other battery powered equipment.

Figure 3:
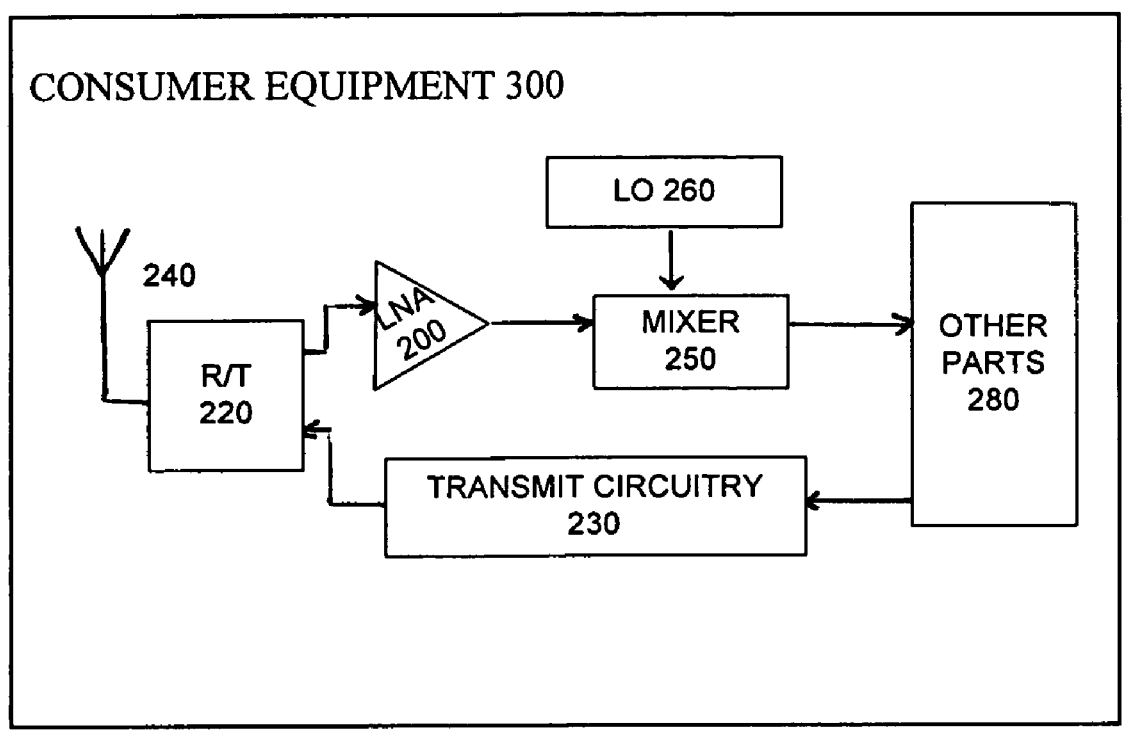
FIG. 3 shows consumer equipment having a receiver having the amplifier according to an embodiment of the invention.

The amplifier can be formed using discrete circuit elements or as an integrated circuit. It can be integrated with other circuitry using conventional techniques. FIG. 3 shows a typical application for the amplifier, as a low noise amplifier for received radio signals. The radio signals can be those provided for any suitable protocol or standard of which the Bluetooth standard is only one example. The figure shows consumer equipment 300, which can be a PCMCIA card or a PCI card for a personal computer, a USB adapter or card, a mobile phone, a personal digital assistant or a modification for a PDA such as a cradle or plug-in to provide the Bluetooth capability, a smart phone, a cordless phone, a Bluetooth access point, e.g. for a local area network, a laptop or notebook computer or organizer, or other commercial or household equipment with a radio link, such as a Bluetooth link or an adapter for other commercial or household equipment with a radio link, e.g. in automotive vehicles and applications. It may also be a module which provides radio services and which may be included with other semiconductor devices, e.g. on a PCB. An antenna 240 feeds a hybrid circuit 220 for combining or separating transmit and receive signals. Received signals are fed to the LNA 200 and then to a mixer 250 fed by a local oscillator LO 260, for generating Intermediate Frequency signals, which are fed to other parts 280, which can include demodulators, decoders, processors, displays and similar. Transmit signals are generated by transmit circuitry 230.

As has been described above, a low noise differential amplifier has a pair of single ended common-electrode arrangements and cross coupling of a main input electrode of one of the pair to the gate or base of the other one of the pair. This cross-coupling puts the differential input voltage over the Gate-Source of each transistor (or Base-Emitter of the each transistor). This means that the same input impedance and gain can be made with half the current compared to a basic common-gate topology. The cross-coupling means the noise generated by the positive side of the common-electrode structure ends up partly on the negative output and vice versa, and so the Noise Figure can be less than 3 dB.

All the embodiments of the present invention may be implemented in CMOS technology. Thus the transistors can be pMOS or nMOS transistors.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A low noise differential amplifier having a pair of single ended circuits, each having a first input electrode coupled to receive opposing parts of a differential input signal to be amplified, and a second input electrode of inverse polarity to the first input electrode, each of the pair having a common electrode, and comprising a cross coupling of the input electrode of each of the pair to the second inverse polarity input electrode of the other one of the pair, wherein each of the single ended circuits comprises a load, an amplifying element and a current source coupled in series, with the first input electrode being between the amplifying element and the current source.

2. The amplifier of claim 1, wherein the amplifying element is a transistor.

3. The amplifier of claim 1, wherein the first (or second, respectively) polarity electrode is a source or emitter electrode and the second (or first, respectively) polarity electrode is a gate or base electrode of a transistor.

4. The amplifier of claim 1, wherein the cross coupling comprising a series coupled capacitor.

5. The amplifier of claim 1, having a resistor for coupling the gate or base of each circuit to a DC bias node.

6. The amplifier of claim 1, the circuit having a field effect transistor.

7. An integrated circuit comprising a low noise differential amplifier having a pair of single ended circuits, each having a first input electrode coupled to receive opposing parts of a differential input signal to be amplified, and a second input electrode of inverse polarity to the first input electrode, each of the pair having a common electrode, the amplifier further comprising a cross coupling of the input electrode of each of the pair to the second inverse polarity input electrode of the other one of the pair, wherein each of the single ended circuits comprises a load, an amplifying element and a current source coupled in series, with the first input electrode being between the amplifying element and the current source.

8. The integrated circuit of claim 7, wherein the amplifying element is a transistor.

9. The integrated circuit of claim 7, wherein the first (or second, respectively) polarity electrode is a source or emitter electrode and the second (or first, respectively) polarity electrode is a gate or base electrode of a transistor.

10. The integrated circuit of claim 7, the cross coupling comprising a series coupled capacitor.

11. The integrated circuit of claim 7, having a resistor for coupling the gate or base of each circuit to a DC bias node.

12. The integrated circuit of claim 7, the circuit having a field effect transistor.

13. A receiver coupled to an antenna for receiving radio signals, and having the amplifier of claim 1 for amplifying the signals received by the antenna.

14. Consumer equipment having an antenna and the receiver of claim 13 coupled to amplify signals received by the antenna.

15. A method of amplifying signals using a pair of single ended circuits, each having a first input electrode coupled to receive opposing parts of a differential input signal to be amplified, and a second input electrode of inverse polarity to the first input electrode, each of the pair having a common electrode and a cross coupling of the input electrode of each of the pair to the second inverse polarity input electrode of the other one of the pair, wherein each of the single ended circuits comprises a load, an amplifying element and a current source coupled in series, the method comprising inputting the differential signal to be amplified between the amplifying element and the current source.

* * * * *

UNITED STATES PATENT AND TRADEMARK OFFICE
CERTIFICATE OF CORRECTION

PATENT NO. : 7,176,759 B2  Page 1 of 1
APPLICATION NO. : 11/022050
DATED : February 13, 2007
INVENTOR(S) : Marc Borremans et al.

It is certified that error appears in the above-identified patent and that said Letters Patent is hereby corrected as shown below:

Title Page
Item (73) should read:
(73) Assignee: STMicrolectronics Belgium N.V.
 Zaventem, Belgium Signed and Sealed this Twenty-seventh Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,176,759 B2
APPLICATION NO. : 11/022050
DATED : February 13, 2007
INVENTOR(S) : Marc Borremans et al.

It is certified that error appears in the above-identified patent and that said Letters Patent is hereby corrected as shown below:

Title Page
Item (73) should read:
(73) Assignee: STMicroelectronics Belgium NV,
Zaventem, (BT.)

This certificate supersedes the Certificate of Correction issued May 27, 2008.

Signed and Sealed this
Twenty-second Day of July, 2014

Michelle K. Lee
*Deputy Director of the United States Patent and Trademark Office*